US005585767A

United States Patent [19]

Wright, Jr.

[11] Patent Number: 5,585,767

[45] Date of Patent: Dec. 17, 1996

[54] IMPEDANCE MATCHING CABLE SYSTEM FOR ELECTRONICALLY COUPLING MUSICAL INSTRUMENTS TO AMPLIFIERS

[76] Inventor: Thomas G. Wright, Jr., 1967 Chrysler Dr. NE., Atlanta, Ga. 30345

[21] Appl. No.: 430,898

[22] Filed: Apr. 27, 1995

[51] Int. Cl.[6] .............................. H03H 11/28

[52] U.S. Cl. .............................. 333/32; 381/118; 381/120

[58] Field of Search .............................. 333/32; 330/297; 381/113, 114, 118, 120

[56] References Cited

U.S. PATENT DOCUMENTS 3,449,523 6/1969 Kishi et al. .............................. 381/113
3,961,202 6/1976 Kono et al. .............................. 381/113 X
4,280,018 7/1981 Lazarus et al. .............................. 381/114
5,018,204 5/1991 Christian .............................. 381/120 X

*Primary Examiner*—Paul Gensler
*Attorney, Agent, or Firm*—Jim Zegeer, Esq.

[57] ABSTRACT

An impedance matching cable system for electronically coupling a musical instrument to an amplifier. The musical instrument has at least one signal output conductor and a common conductor. A field effect transistor (FET) having gate, source and drain electrodes is connected to a bipolar direct current voltage supply having a pair of voltage end point connections and a center point voltage connection by connecting the source electrode to one of said voltage end point connections, and the current control device connecting the drain electrode to the other voltage end point connection. The center voltage connection point is connected to the common conductor and a coupler AC voltage at the drain electrode to the amplifier.

7 Claims, 2 Drawing Sheets

IMPEDANCE MATCHING CABLE SYSTEM FOR ELECTRONICALLY COUPLING MUSICAL INSTRUMENTS TO AMPLIFIERS

BACKGROUND OF THE INVENTION

There are many musical instruments which have an electrical pick-up that has a relatively high impedance (e.g., about 250K ohms or above) which outputs a signal that must be coupled to an amplifier which may be some distance away. In order to maintain fidelity, sustain, and avoid noise, the output impedance of the musical instrument must be properly matched to the input impedance of the amplifier. While proper termination has long been a factor in professional audio implementations, it has not been previously considered in the proper interface of the pick-up based instruments.

The object of the present invention is to provide a proper termination of the instrument pick-up and, at the same time, provide a proper source impedance to the amplifier. While the present invention does not amplify the signal, it does provide noticeable improvements in matching which results in a wider and a more even frequency response with the lower noise and with an apparent increase in volume. Sustain characteristics of the instrument are also improved. Thus, the present invention prevents deterioration of the instrument signal due to loss of fidelity and build-up in noise, as compared to normal instrument interface techniques.

According to the invention, an impedance matching cable system for electronically coupling a musical instrument to an amplifier includes a field effect transistor (FET) having gate, source and drain electrodes and a bipolar direct current voltage supply having a pair of end voltage point connections and a center point voltage connection. A current control device connects the center voltage connection point to the common conductor of the musical instrument and the signal conductor of the musical instrument is connected to the GATE electrode of the field effect transistor, and a DC isolating capacitor couples an AC signal voltage from the drain electrode to the amplifier. A high resistor is connected between the GATE electrode and the common conductor.

In a preferred embodiment, a male telephone-type plug connector has a tubular housing and the field effect transistor is mounted within the tubular housing and epoxyed or sealed-in. In a further preferred embodiment, the bipolar direct current supply and its voltage connection points are connected to three terminal XLR female connectors and the source and drain electrodes and common conductor are connected to a corresponding three-terminal XLR male connector. To provide greater distances, a shielded cable with a pair of signal conductors and a shield conductor has a corresponding XLR female plug at one end thereof and an XLR male plug at the opposite end which are adapted to connect the bipolar battery supply system to the FET transistor.

DESCRIPTION OF THE DRAWINGS

The above and other objects, advantages and features of the invention will become more apparent when considered with the following specification and accompanying drawings wherein.

DETAILED DESCRIPTION OF THE INVENTION

Figure 1:
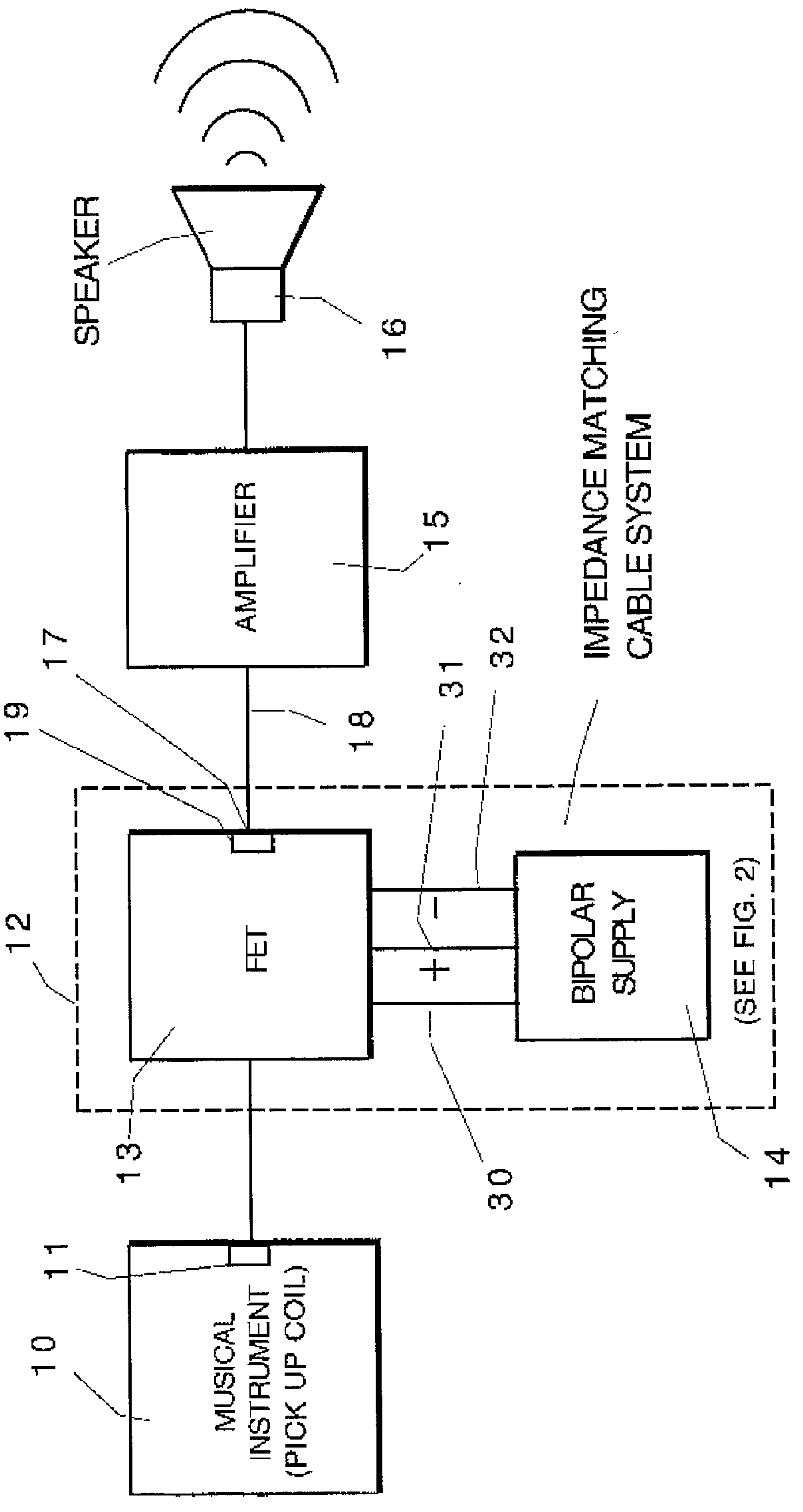
FIG. 1 is a block diagram of a musical instrument amplifier system incorporating the invention.

Referring now to the FIG. 1, a musical instrument 10, which may be a guitar having a pick-up coil, is electrically coupled to a female output receptacle 11 which may be a female phone jack-type output to supply signal to the impedance matching cable system 12 which includes field effect transistor circuit 13 and its bipolar source 14 and outputs the signal to amplifier 15 and speaker 16.

In the normal straight-forward pick-up, the amplifier 15 has a male connector which plugs into the female jack 11 of the musical instrument but, in the present case, the ¼" male phone connector 17 on the end of cable 18 is plugged into ¼" female phone jack 19 at the end of impedance matching cable system 12.

Figure 2:
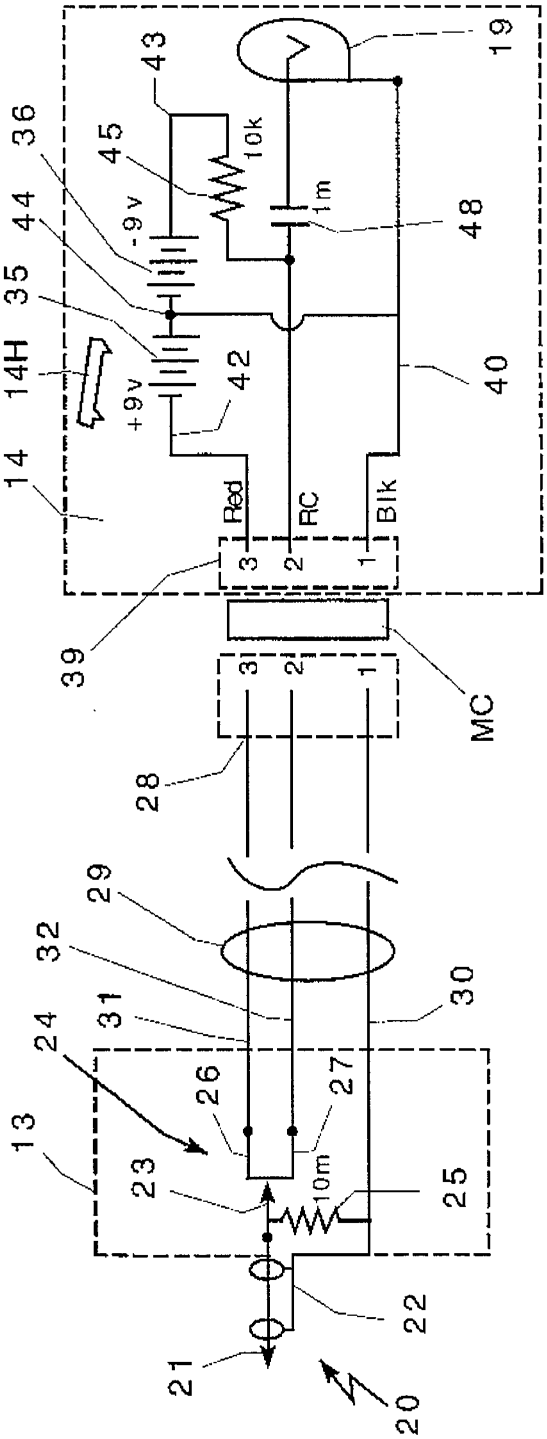
FIG. 2 is a circuit diagram of the invention.

Referring now to FIG. 2, the ¼" male phone plug 20 has a tip or center conductor 21 and a ground or common conductor 22. The signal conductor 21 is connected to the GATE electrode 23 of FET transistor 24 and a large resistor 25 (10 megohm) is connected between the common conductor 22 and GATE electrode 23 so that the signal is applied to the GATE electrode 23. FET transistor 24 has a source electrode 26 and a drain electrode 27 which are connected to a male XLR plug 28. As shown in FIG. 2, the cabling 29 is actually a shielded cable with the common conductor 22 connected to shield 30 and the source electrode and drain electrode of the FET transistor 24 connected to conductors 31 and 32, respectively. Cable 29 and XLR connectors 28 and 39 could be eliminated, but preferably, the bipolar power supply 14 is provided in a separate housing indicated generally by 14H which may have a removable cover so that the batteries 35, 36 may be replaced. In the embodiment shown in FIG. 2, the cabling 29 is about tell feet and has a ¼" male phone plug 20 at one end which houses field effect transistor 24, a male XLR plug 28 at the right end shown in FIG. 2. To extend the length of this cable, any high quality balanced microphone cable MC (XLR male at one end and XLR female at the other end) may be used. In such case, the cable extension MC can be plugged in between the ¼" XLR cable supply 28 and the bipolar source 14 which has a female XLR receptacle 39. According to the invention, up to at least 100 feet of extra cable can be inserted with no loss of fidelity or increase in noise.

XLR connector 39 receives XLR male connector 28 and thus couples the source and drain electrodes 26, 27, respectively, to the bipolar supply while the conductor 30 is connected to the common conductor 40 in the bipolar supply circuit 14. Bipolar supply 14 has a pair of batteries, typically about 9 volts. These batteries have a pair of end point voltage connections 42, 43 and a center point voltage connection 44 which is connected to common or ground conductor 40 in the battery box 14. A current control device such as 10K ohm resistor 45 connects the end voltage point connection 43 to the conductor 32 which is connected to the drain electrode 27 of FET transistor 24. Output signals are coupled through DC isolation capacitor 48 to a ¼" female phone jack 19 which is mounted for access from the exterior of the housing 14A.

In operation, FET transistor 24 is an impedance converter. The potential on GATE electrode 23 is set at 0 potential in respect to DC and the source electrode 26 and drain electrodes 27 (they could be reversed) are connected between the bipolar supply 35, 36. Thus, since there is a positive DC voltage on the source electrode of the field effect transistor 24 and a negative supply on the drain electrode 27, when an AC signal is applied to GATE 23, the voltage swings 18 volts (+ or −9 volts) less the voltage loss at the junction. The resistor 45 sets the bias on the field effect transistor 24 so that instead of getting gain out of the field effect transistor 24, it becomes a unity gain impedance converter.

The resistor 45 could be a constant current FET. This 10K ohm resistor could be replaced by a constant current generator (such as another FET) so that if you load down the output, the current generator will maintain the current and allow the voltage swing to continue.

Figure 3:
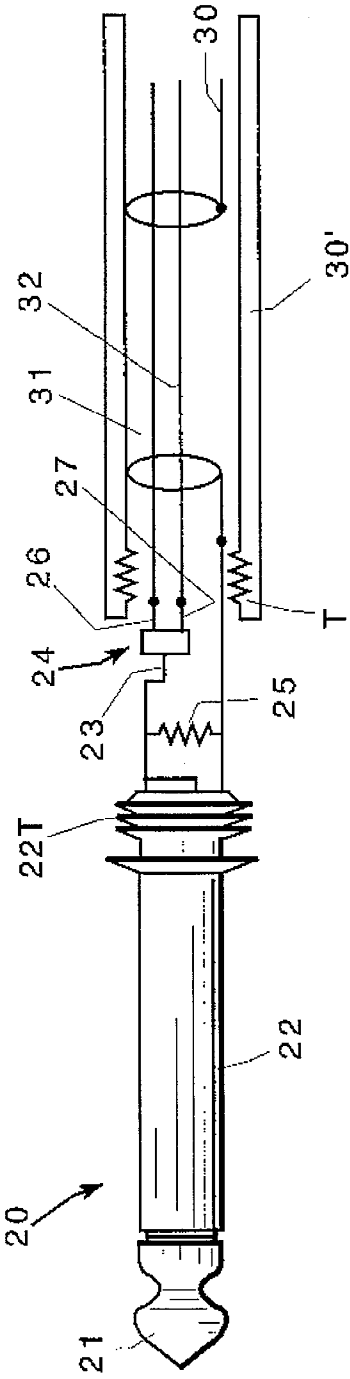
FIG. 3 is a partially exploded diagrammatic illustration of a ¼" phone plug in which the FET transistor has been incorporated.

Referring now to FIG. 3, the FET transistor 24 is actually housed within cylindrical shield 30' which has a threaded fitment end T for threaded engagement with the threaded external end 22T. The parts are assembled with the threaded barrel 30' threadingly engaged with the common portion 22 of the plug 20, the housing is filled with an epoxy such as an epoxy filled from a hot glue gun so as to provide strain relief and to encapsulate FET transistor 24 and resistor 25 and thereby protect them from damage.

The frequency response of the unit as illustrated is 20 Hz to 30 kHz (−1, +0 dBv). The unit improves the fidelity, sustain and noise by properly matching the output impedance of the musical instrument such a guitar with the input impedance of the power amplifier. The present invention accomplishes the improvement in two ways, it properly terminates the instrument pick-ups and, at the same time, presents a proper source impedance to the amplifier. The invention prevents deterioration of instrument signals due to loss of fidelity and build-up and noise when using normal instruments as contrasted with normal interfacing techniques. Obviously, it does not solve the problem caused by pick-up itself or noisy associated circuity in the instrument. As discussed earlier, the cable 29 is about 10 feet but an extension cable MC can be inserted having XLR cable connectors. It should be noted that the FET transistor is located typically close to the musical instrument while the bipolar supply 14 can be located some distance away (at least 100 feet) with no loss of fidelity or increase in noise. The power supply unit 14 requires two 9 volt batteries. While current requirement for these batteries is very low, it is suggested that the XLR plug be disconnected from the power supply when not in use as this will eliminate any current to drain and will extend the life of the batteries.

While preferred embodiments of the invention have been disclosed and illustrated and described, it will be appreciated that other embodiments, adaptations and variations of the invention will be readily apparent to those skilled in the art.

What is claimed is:

1. An impedance matching cable system for electronically coupling a musical instrument to an amplifier, said musical instrument having at least one signal output conductor and a common conductor, comprising:

a field effect transistor (FET) having gate, source and drain electrodes, a bipolar direct current voltage supply having a pair of voltage end point connections and a center point voltage connection, means connecting said gate electrode to said at least one signal output conductor, means connecting said source electrode to one of said voltage end point connections, a current control device connecting said drain electrode to the other of said voltage end point connections, means connecting said center voltage connection point to said common conductor, and DC isolating capacitance coupling means coupling AC voltages at said drain electrode to said amplifier.

2. The impedance matching cable system defined in claim 1 including a high value resistor connected between said gate control and said common conductor wherein said current control means is said high value resistor and being of sufficient value relative to said FET transistor that the current through said resistor is substantially constant.

3. The impedance matching cable system defined in claim 1 including a male plug connector having a tubular housing and means mounting said FET transistor in said tubular housing and means sealing said FET in said tubular housing.

4. The impedance matching cable system defined in claim 3 wherein said bipolar direct current supply voltage connection points are connected to a three terminal XLR female connector, and said source and drain electrodes and said common conductor are connected to a corresponding three terminal XLR male connector.

5. The impedance matching cable system defined in claim 4 including an extension cable system, said extension cable system including a shielded cable having a pair of signal conductors and a shield conductor, a XLR female plug at one end of said shielded cable and an XLR male plug at the other end of said shielded conductor and adapted to connect with the first named respective XLR male and XLR female connectors, respectively.

6. The impedance matching cable system defined in claim 4 including a housing for said bipolar direct current supplies wherein said housing protects said current control means and said DC isolating capacitance coupling means.

7. The impedance matching cable system defined in claim 3 including a female telephone connector means connecting said female telephone connector to said isolating capacitance and said common conductor.

* * * * *